United States Patent [19]

Im

[11] Patent Number: 5,971,607
[45] Date of Patent: Oct. 26, 1999

[54] POLYNOMIAL EVALUATOR FOR USE IN A REED-SOLOMON DECODER

[75] Inventor: Yong-Hee Im, Seoul, Rep. of Korea

[73] Assignee: Daewoo Electronics Co., Ltd.

[21] Appl. No.: 08/755,579

[22] Filed: Nov. 25, 1996

[30] Foreign Application Priority Data

May 10, 1996 [KR] Rep. of Korea ....................... 96-15344

[51] Int. Cl.[6] .................................................. H03M 13/00
[52] U.S. Cl. ..................... 371/37.11; 371/37.4; 371/37.7; 371/40.3; 371/35; 371/37.8
[58] Field of Search .............................. 371/37.11, 37.12, 371/37.5, 37.4, 37.7, 37.01, 37.08, 40.3, 40.14, 40.11, 41

[56] References Cited

U.S. PATENT DOCUMENTS

| | | | |
|---|---|---|---|
| 4,162,480 | 7/1979 | Berlekamp | 340/146.1 |
| 4,649,541 | 3/1987 | Lahmeyer | 371/37.11 |
| 4,958,348 | 9/1990 | Berlekamp et al. | 371/37.1 |
| 5,323,402 | 6/1994 | Vaccaro et al. | 371/37.1 |
| 5,644,695 | 7/1997 | Blaum et al. | 395/182.04 |

OTHER PUBLICATIONS

G.C. Clark, Jr. and J. Bibb Cain, "Error–Correction Coding for Digital Communications" Plenum Press, New York and London, 1981, pp. 188–pp. 195.

R.T. Chien, "Cyclic Decoding Procedures for Bose–Chaudhuri–Hocquenghem Codes" IEEE Transactions on Information Theory, vol. 10, 1964, pp. 357–pp. 363.

*Primary Examiner*—Reba I. Elmore
*Assistant Examiner*—Marc McDieunel
*Attorney, Agent, or Firm*—Pennie & Edmonds LLP

[57] ABSTRACT

An apparatus, for use in a Reed-Solomon decoder, evaluates a polynomial P(X) iteratively, by substituting $\alpha^{-(N-j)}$ for X in a jth iteration, to thereby provide a jth evaluation result $P(\alpha^{-(N-j)})$, wherein j is an integer ranging from 1 to N, N being a predetermined positive integer, and α is a primitive element in a finite field $GF(2^m)$. The apparatus comprises: a FIFO buffer having T registers, T being a predefined positive integer; a root input block for sequentially providing a first group of T elements in the finite field during the jth iteration; a multiplier for sequentially multiplying the contents of the FIFO buffer with the first group of T elements in the finite field provided from the root input block, to thereby provide a jth set of T evaluating terms during the jth iteration; a multiplexor for providing T initial evaluating terms to the FIFO buffer during an initialization and providing the jth set of T evaluating terms to the FIFO buffer during the jth iteration, to be stored therein; an addition block for determining a sum of the T evaluating terms of the jth set, to thereby provide a jth sum; and an output block for adding a 0th coefficient of the polynomial to the jth sum, to thereby provide the jth evaluation result during the jth iteration.

24 Claims, 4 Drawing Sheets

POLYNOMIAL EVALUATOR FOR USE IN A REED-SOLOMON DECODER

FIELD OF THE INVENTION

The present invention relates to an apparatus for correcting errors present in stored or transmitted data; and, more particularly, to an apparatus for evaluating an error evaluator polynomial, an error locator polynomial and a differential polynomial which are used in correcting errors in the data encoded by using a Reed-Solomon code.

DESCRIPTION OF THE PRIOR ART

Noises occurring during a process of transmitting, storing or retrieving data can in turn cause errors in the transmitted, stored or retrieved data. Accordingly, various encoding techniques, having the capability of rectifying such errors, for encoding the data to be transmitted or stored have been developed.

In such encoding techniques, a set of check bits is appended to a group of message or information bits to form a codeword. The check bits, which are determined by an encoder, are used to detect and correct the errors. In this regard, the encoder essentially treats the bits comprising the message bits as coefficients of a binary message polynomial and derives the check bits by multiplying the message polynomial i(X) with a code generating polynomial g(X) or dividing i(X) by g(X), to thereby provide ea codeword polynomial c(X). The code generating polynomial is selected to impart desired properties to a codeword upon which it operates so that the codeword will belong to a particular class of error-correcting binary group codes (see, e.g., S. Lin et al., "Error Control Coding: Fundamentals and Applications", Prentice-Hall, 1983).

One class of error correcting codes is the well-known BCH (Bose-Chaudhuri-Hocquenghen) codes, which include the Reed-Solomon ("RS") code. The mathematical basis of the RS code is explained in, e.g., the aforementioned reference by Lin et al. and also in Berlekamp, "Algebraic Coding Theory", McGraw-Hill, 1968, which is further referred to in U.S. Pat. No. 4,162,480 issued to Berlekamp.

If roots of the generator polynomial g(X) of the RS code are 2T consecutive powers of $\alpha$ as in Eq. (1), T being a predetermined positive integer, as many as T errors can be corrected:

$$g(X) = \prod_{i=1}^{2T} (X - \alpha^i) \qquad \text{Eq. (1)}$$

wherein $\alpha$ is a primitive element in a finite field $GF(2^m)$.

In the process of receiving or retrieving a transmitted or stored codeword, certain attendant noises may have been converted to an error pattern in the codeword. In order to deal with the error pattern imposed upon the RS code, a four step procedure is generally utilized. In discussing the error-correcting procedure, reference shall be made to a RS code consisting of codewords containing N M-bit symbols, N and M being positive integers, (of which K symbols are informational symbols and (N-K) symbols are check symbols, K being a positive integer smaller than N). In that case, c(X) becomes an (N-1)st order polynomial and 2T equals (N-K). As a first error correcting step, syndromes $S_0, S_1, \ldots, S_{2T-1}$ are calculated from a received codeword polynomial r(X), i.e., an (N-1)st order polynomial representing the received codeword. The received codeword polynomial r(X) is represented as $r_{N-1}X^{N-1}+r_{N-2}+ \ldots +r_1X^1+r_0$, wherein $r_j$ is an (N-j)th symbol of a codeword. As a second step, using the syndromes, coefficients of an error locator polynomial $\sigma(X)$ are calculated. In a third step, the error locator polynomial $\sigma(X)$ is solved to obtain its roots, which represent the error locations in the received codewords. Specifically, if substituting a power of the primitive element, $\alpha^{-j}$, for a variable X in the error locator polynomial $\sigma(X)$ results in 0 (i.e., $\alpha^{-j}$ becomes a root of $\sigma(X)$), it means that an error has occurred in $r_j$, i.e., (N-j)th symbol of a codeword.

As a fourth step, error values are calculated by using the error locations and the syndromes. Mathematical expressions for the syndromes and the coefficients of the error locator polynomial are set forth in the afore-referenced U.S. Pat. No. 4,162,480 issued to Berlekamp.

The fourth step will be now explained in more detail.

First, an error evaluator polynomial $\Omega(X)$ may be obtained as follows:

$$\Omega(X) = \sigma(X)S(X) \qquad \text{Eq. (2)}$$

wherein S(X) is a syndrome polynomial whose coefficients are the syndromes.

After deriving the error evaluation polynomial $\Omega(X)$, an error value $e_j$ may be calculated as $$e_j = \alpha^j \frac{\Omega(\alpha^{-j})}{\sigma'(\alpha^{-j})} \qquad \text{Eq. (3)}$$

wherein $\sigma'(X)$ is the first derivative of the error locator polynomial $\sigma(X)$; $\alpha^{-j}$ is the root of the error locator polynomial obtained in the third step; and the error value $e_j$ corresponds to the (N-j)th symbol which is an error location obtained in the third step.

After finding the error values, the original codeword can be recovered by adding the error values to the corresponding symbols.

As explained above, polynomial evaluation is used in various stages of error correcting procedures, wherein the polynomial evaluation for $\alpha^{-j}$ refers to substitution of the finite field element $\alpha^{-j}$ for a variable X in a given polynomial p(X). First, the error locator polynomial $\sigma(X)$ is evaluated in the third step to find error locations. In the fourth step, the error evaluator polynomial $\Omega(X)$ and the differential polynomial $\sigma'(X)$ are evaluated to determine error values.

The error evaluator polynomial $\Omega(X)$ may be represented as $$\Omega(X) = \sum_{i=0}^{T} \Omega_i \cdot X^i \qquad \text{Eq. (4)}$$

Accordingly, evaluating $\Omega(X)$ for $X=\alpha^{-j}$ gives $$\Omega(\alpha^{-j}) = \sum_{i=0}^{T} \Omega_i \cdot (\alpha^{-j})^i \qquad \text{Eq. (5A)}$$

$$= \sum_{i=0}^{T} \Omega_i \cdot (\alpha^{-i})^j \qquad \text{Eq. (5B)}$$

wherein j is an integer ranging from 0 to N-1, and multiplications and additions are done on the finite field $GF(2^m)$. Evaluation results for other polynomials may be represented in a similar manner.

Referring to FIG. 1, there is shown an exemplary block diagram of a conventional polynomial evaluator 10 which is disclosed in a copending commonly owned application, U.S. Ser. No. 08/755,581, entitled "Polynomial Evaluator for use in a Reed-Solomon Decoder". The evaluator 10 shown in FIG. 1 evaluates the error evaluator polynomial $\Omega(X)$ by implementing Eq. (5B) in case of T=8.

The polynomial evaluator 10 includes a multiplier 11 operating on the finite field $GF(2^m)$, a root input block 12, a multiplexor ("MUX") 16, a register block 18, an addition block 13 and an output block 14.

At the polynomial evaluator 10, the calculation of Eq. (5B) is done iteratively from j=0 to N−1. An iteration may be preferably done in one system clock cycle.

Before starting the 0th iteration of the evaluation procedure for determining $\Omega(\alpha^0)$, the registers included in the register block 18 are initialized with $\Omega_i$'s. To do this, each of the coefficients of the error evaluator polynomial ($\Omega_1$ to $\Omega_8$) is sequentially fed through the MUX 16 to the register block 18 one for one bit clock cycle. A selection signal SEL1 controls the MUX 16 to provide $\Omega_i$ on an input port 0 to the register block 18 for the initialization. A first coefficient $\Omega_1$ is first fed to $R_1$ and stored therein for a bit clock cycle. The contents of $R_1$ are shifted to $R_2$ and stored therein for a next bit clock cycle, and then to $R_3$, and so on. Finally, the output of $R_8$ is fed to the multiplier 11. In conclusion, a coefficient is stored in each of the registers sequentially for a bit clock cycle as it is shifted through the registers before it is fed to the multiplier 11.

After each of the registers is filled with a corresponding $\Omega_i$ (e.g., $\Omega_1$ in $R_8$, $\Omega_2$ in $R_7$, and so on), the 0th iteration for determining $\Omega(\alpha^0)$ begins.

During the first bit clock of the 0th iteration, the multiplier 11 multiplies 1 with $\Omega_1$, provided thereto from $R_8$. To do this, 1 is fed from the root input block 12 to the multiplier 11. (It should be rioted that, during the 2nd to Nth iterations, $\alpha^{-i}$'s, i being 1 to 8, are fed to the multiplier 11, to be multiplied to the corresponding evaluating terms provided from the register block 18.) The output of the multiplier 11, i.e., $\Omega_1$ (or in other words, 1st evaluating term of the 0th set, the 0th set of evaluating terms referring to $\Omega_i\alpha^0$'s), is fed to the addition block 13 one per one bit clock cycle.

The addition block 13 includes a two input adder 13a and a register 13b, wherein the adder 13a operating on the finite field $GF(2^m)$ sequentially adds each of the evaluating terms provided from the multiplier 11 to the contents of the register 13b and the register 13b stores a 1st to 7th partial sum of the evaluating terms provided from the adder 13a and feeds the partial sum to the two input adder 13a, the Lth partial sum referring to sums of L evaluating terms, L being 1 to 7, in the course of sequential addition of Eq. (5B).

Specifically, upon receiving $\Omega_1$ from the multiplier 11, the adder 13a adds it to the initial content, i.e., 0, of the register 13b. Then the 1st partial sum, $\Omega_1$, is fed back to the register 13b, to be stored therein, e.g., at the rising edge of the next bit clock. $\Omega_1$ provided from the multiplier 11 is also fed to the register block 18, to thereby shift the contents of each register to right, e.g., on the rising edge of the second bit clock of the first iteration. The contents of the registers, during the second bit clock cycle, are given in Table 1.

TABLE 1

| $R_1$ | $R_2$ | $R_3$ | $R_4$ | $R_5$ | $R_6$ | $R_7$ | $R_8$ |
|---|---|---|---|---|---|---|---|
| $\Omega_1$ | $\Omega_8$ | $\Omega_7$ | $\Omega_6$ | $\Omega_5$ | $\Omega_4$ | $\Omega_3$ | $\Omega_2$ |

During the second bit clock of the 0th iteration, the multiplier 11 multiplies 1 with $\Omega_2$ provided thereto from $R_8$. The output of the multiplier 11, i.e., $\Omega_2$ at this time, is fed to the adder 13a, wherein it is added to the contents of the register 13b, i.e., $\Omega_1$. Then the second partial sum, $\Omega_1+\Omega_2$, is fed back to the register 13b, to be stored therein. $\Omega_2$ from the multiplier 11 is fed to the register block 18, to thereby shift contents of each register to right on the rising edge of the next bit clock cycle. Then, the contents of the registers are changed as given in Table 2.

TABLE 2

| $R_1$ | $R_2$ | $R_3$ | $R_4$ | $R_5$ | $R_6$ | $R_7$ | $R_8$ |
|---|---|---|---|---|---|---|---|
| $\Omega_2$ | $\Omega_1$ | $\Omega_8$ | $\Omega_7$ | $\Omega_6$ | $\Omega_5$ | $\Omega_4$ | $\Omega_3$ |

By repeating the above procedure for the remaining bit clock cycles of the 0th iteration, $\Omega_1$ to $\Omega_8$ is summed at the addition block 13. The addition block 13 finally provides an 8th partial sum, i.e., a sum of the 8 evaluating terms ($\Omega_1\alpha^{-j}+\Omega_2\alpha^{-2j}+\ldots\Omega_8\alpha^{-8j}$, j=0 at this time) to the output block 14. The sum, i.e., $\Omega_1+\Omega_2+\ldots+\Omega_8$, is fed to and stored in $R_{10}$ under the contorl of a signal RST_SUM provided externally and then fed to an adder 14b wherein it is added to $\Omega_0$, to thereby provide the final evalaution result of the 0th iteration, i.e., 0th evaluation result $\Omega(\alpha^0)$. RST_SUM is a signal that notifies the time when an evaluation result is provided from the adder 13a. RST_SUM may be a signal that goes to "1" at the end of each iteration (equivalently at the start of a next iteration). RST_SUM also serves to initialize the register 13b with 0 for a next iteration. (Note that the content of register 13b should be 0 at the start of each iteration.)

The first iteration is similar to the 0th iteration except that $\alpha^{-i}$, instead of 1, is multiplied with an output from the register block 18, $\Omega_i$, one by one at the multiplier 11, to provide a first set of evaluating terms $\Omega_i\alpha^{-i}$'s to the addition block 13 and back to the register block 18. Specifically, $\alpha^{-1}$ is multiplied with $\Omega_1$ during the first bit clock cycle, $\alpha^{-2}$ with $\Omega_2$ during the second bit clock cycle, and so on. By summing the first set of evaluating terms, $\Omega_i\alpha^{-i}$'s, the first evaluation result $\Omega(\alpha^{-1})$ is obtained at the end of the first iteration. By repeating the above procedure, $\Omega(\alpha^{-j})$'s for j=0 to N−1 are obtained in N iterations.

The contents of the registers $R_1$ to $R_8$ and $R_9$ for each bit clock cycle of the 0th to 2nd iterations are shown in Table 3, wherein each row corresponds to each bit clock cycle.

TABLE 3

| iteration | $R_1$ | $R_2$ | ... | $R_7$ | $R_8$ | $R_9$ |
|---|---|---|---|---|---|---|
| 0th | $\Omega_8$ | $\Omega_7$ | ... | $\Omega_2$ | $\Omega_1$ | 0 |
|  | $\Omega_1$ | $\Omega_8$ |  | $\Omega_3$ | $\Omega_2$ | $\Omega_1$ |
|  | . | . |  | . | . | . |
|  | . | . |  | . | . | . |
|  | . | . |  | . | . | . |
|  | $\Omega_7$ | $\Omega_6$ |  | $\Omega_1$ | $\Omega_8$ | $\Omega_1+\ldots+\Omega_7$ |
| 1st | $\Omega_8$ | $\Omega_7$ | ... | $\Omega_2$ | $\Omega_1$ | 0 |
|  | $\Omega_1\alpha^{-1}$ | $\Omega_8$ |  | $\Omega_3$ | $\Omega_2$ | $\Omega_1\alpha^{-1}$ |
|  | $\Omega_2\alpha^{-2}$ | $\Omega_1\alpha^{-1}$ |  | $\Omega_4$ | $\Omega_3$ | $\Omega_1\alpha^{-1}+\Omega_2\alpha^{-2}$ |
|  | . | . |  | . | . | . |
|  | . | . |  | . | . | . |
|  | $\Omega_7\alpha^{-7}$ | $\Omega_6\alpha^{-6}$ |  | $\Omega_1\alpha^{-1}$ | $\Omega_8$ | $\Omega_1\alpha^{-1}+\ldots+\Omega_7\alpha^{-7}$ |
| 2nd | $\Omega_8\alpha^{-8}$ | $\Omega_7\alpha^{-7}$ | ... | $\Omega_2\alpha^{-2}$ | $\Omega_1\alpha^{-1}$ | 0 |
|  | $\Omega_1\alpha^{-2}$ | $\Omega_8\alpha^{-8}$ |  | $\Omega_3\alpha^{-3}$ | $\Omega_2\alpha^{-2}$ | $\Omega_1\alpha^{-2}$ |
|  | $\Omega_2\alpha^{-4}$ | $\Omega_1\alpha^{-2}$ |  | $\Omega_4\alpha^{-4}$ | $\Omega_3\alpha^{-3}$ | $\Omega_1\alpha^{-2}+\Omega_2\alpha^{-4}$ |

TABLE 3-continued

| iteration | $R_1$ | $R_2$ | ... | $R_7$ | $R_8$ | $R_9$ |
|---|---|---|---|---|---|---|
| | . | . | | . | . | . |
| | . | . | | . | . | . |
| | . | . | | . | . | . |
| | $\Omega_7\alpha^{-14}$ | $\Omega_6\alpha^{-12}$ | | $\Omega_1\alpha^{-2}$ | $\Omega_8\alpha^{-8}$ | $\Omega_1\alpha^{-2} + \ldots +$ $\Omega_7\alpha^{-14}$ |

In accordance with the conventional polynomial evaluator explained above, the evaluation results are provided sequentially in the order of $\Omega(\alpha^0), \Omega(\alpha^{-1}), \ldots, \Omega(\alpha^{-(N-1)})$, which in turn renders the error value $e_j$ with a smaller j be provided first. However, the received symbol is provided in the order of $r_{N-1}$ to $r_0$. Therefore, to correct the errors in the codeword, the received symbol $r_j$ should first be stored in a LIFO (Last In First Out) buffer and provided in a reversed order before it is added to a corresponding error value $e_j$.

SUMMARY OF THE INVENTION

It is, therefore, a primary object of the present invention to provide a polynomial evaluator which provides evaluation results in such an order that the evaluation results used in determining an error value for a first received symbol be provided first.

In accordance with the present invention, there is provided an apparatus, for use in a Reed-Solomon decoder, for evaluating a polynomial P(X) iteratively, by substituting $\alpha^{-(N-j)}$ for X in a jth iteration, to thereby provide a jth evaluation result $P(\alpha^{-(N-j)})$, wherein j is an integer ranging from 1 to N, N being a predetermined positive integer, and $\alpha$ is a primitive element in a finite field $GF(2^m)$, the apparatus comprising:

a FIFO buffer having T registers, T being a predefined positive integer;

updating means for sequentially multiplying the contents of the FIFO buffer with a first group of T elements in the finite field, to thereby provide a jth set of T evaluating terms during the jth iteration;

a multiplexor for providing T initial evaluating terms to the FIFO buffer during an initialization and providing the jth set of T evaluating terms to the FIFO buffer during the jth iteration, to be stored therein;

an addition block for determining a sum of the T evaluating terms of the jth set, to thereby provide a jth sum; and an output block for adding a 0th coefficient of the polynomial to the jth sum, to thereby provide the jth evaluation result during the jth iteration.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 2:
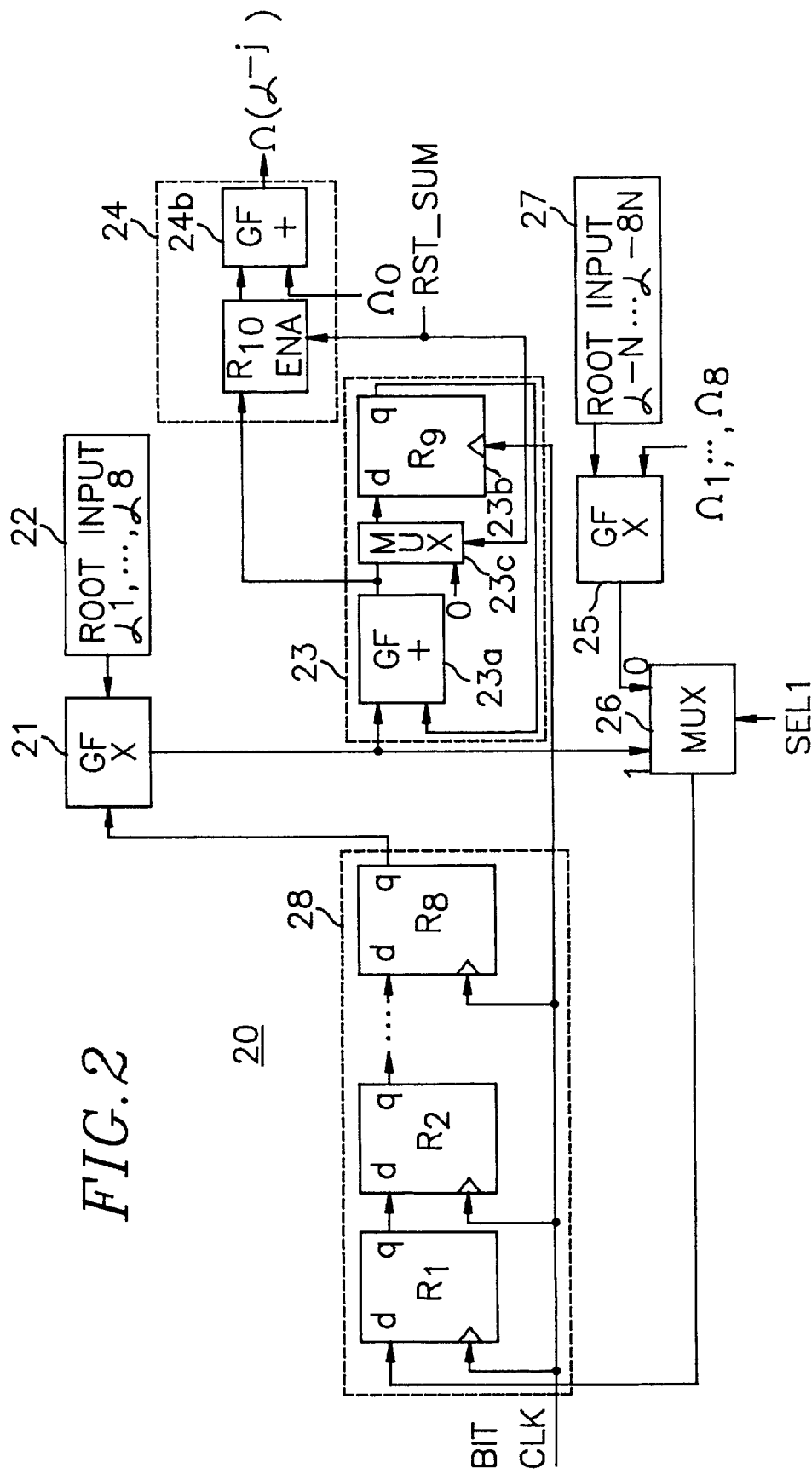
FIG. 2 illustrates a block diagram of a first embodiment of the polynomial evaluator for evaluating an error evaluator polynomial in accordance with the present invention.

Referring to FIG. 2, there is provided a block diagram of a first embodiment of the polynomial evaluator in accordance with the present invention, which evaluates the error evaluator polynomial $\Omega(X)$ according to $$\Omega(\alpha^{-j}) = \sum_{i=0}^{T} \Omega_i \cdot (\alpha^{-i})^j \qquad \text{Eq. (5B)}$$

for j=N−1 to 0, wherein T is set to 8 for the purpose of illustration.

At the polynomial evaluator 20, the calculation of Eq. (5B) is done iteratively from j=N−1 to 0 in that order, which is one of the main differences from the conventional evaluator shown in FIG. 1. An iteration may be preferably done in one system clock cycle.

Figure 1:
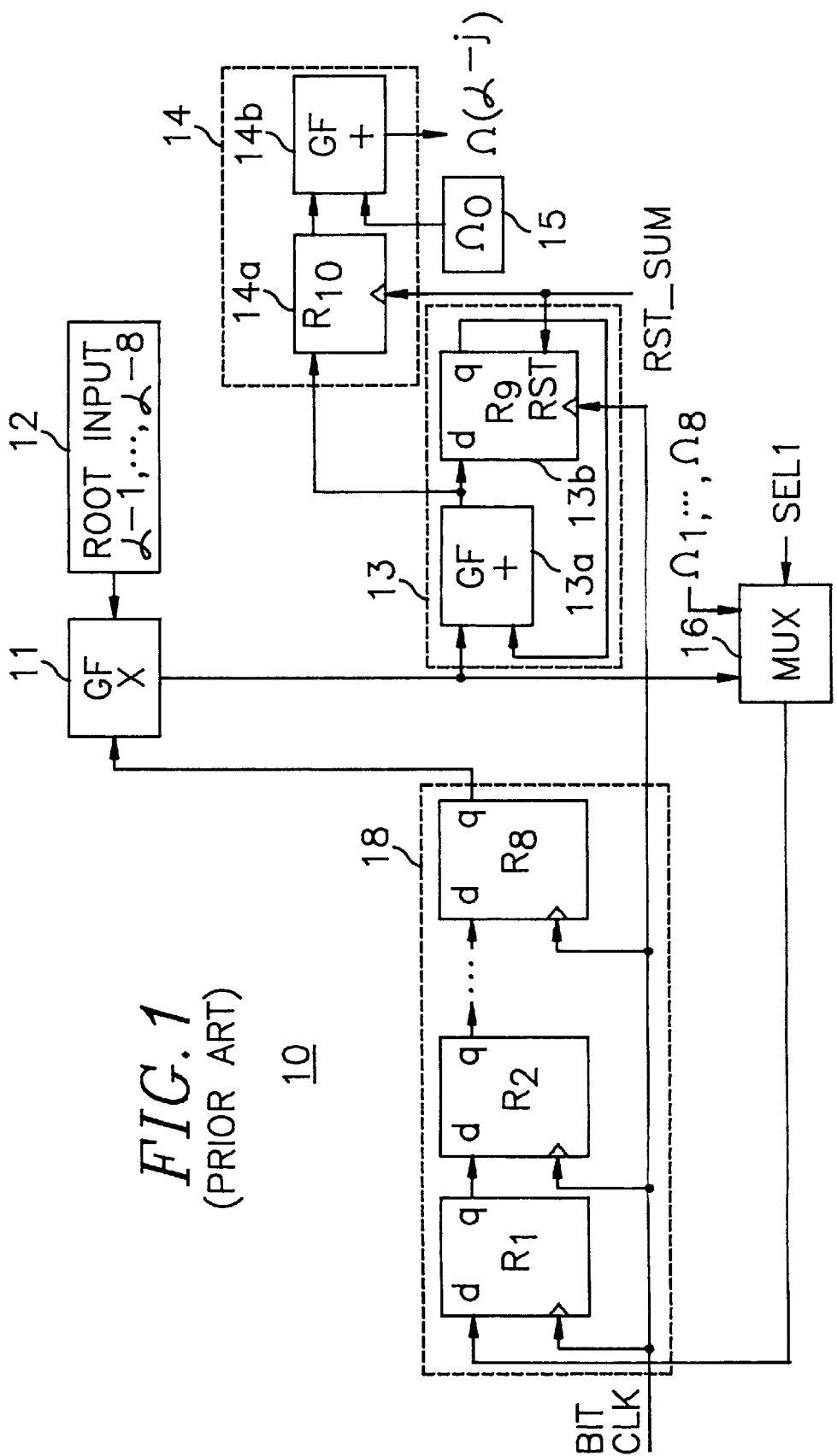
FIG. 1 shows a block diagram of a conventional polynomial evaluator.

The polynomial evaluator 20 shown in FIG. 2 includes a multiplier 21 operating on the finite field $GF(2^m)$, a root input block 22, a multiplexor ("MUX") 26, an addition block 23, an output block 24 and a register block 28, which directly correspond to those of the conventional evaluator shown in FIG. 1. It also includes a multiplier 25 operating on the finite field $GF(2^m)$ and a root input block 27 which is used in initializing the register block 28.

While the register block 18 shown in FIG. 1 is initialized with the coefficients of the evaluator polynomial $\Omega_i$'s, the register block 28 shown in FIG. 2 is initialized with initial evaluating values ($\Omega_i\alpha^{-iN}$'s) with the help of the multiplier 25 and the root input block 27.

Before starting a first iteration of the evaluation procedure for determining $\Omega(\alpha^{-(N-1)})$, the registers included in the register block 28 are initialized with $\Omega_i\alpha^{-iN}$'s. To do this, each of the coefficients of the error evaluator polynomial $\Omega_i$ is multiplied to $\alpha^{-iN}$, to sequentially provide a set of 8 initial evaluating terms $\Omega_i\alpha^{-iN}$'s to an input port 0 of the MUX 26. A selection signal SEL1 controls the MUX 26 to provide $\Omega_i\alpha^{-iN}$ to the register block 28 for the initialization. A first initial evaluating term $\Omega_1\alpha^{-N}$ is first fed to $R_1$ and stored therein for a bit clock cycle. The content of $R_1$ is shifted to $R_2$ and stored therein for a next bit clock cycle, and then to $R_3$, and so on. Finally, the output port of $R_8$ is connected to the multiplier 21.

After each of the registers is filled with a corresponding $\Omega_i\alpha^{-iN}$ (e.g., $\Omega_1\alpha^{-N}$ in $R_8$, $\Omega_2\alpha^{-2N}$ in $R_7$, and so on), the first iteration for determining $\Omega(\alpha^{-(N-1)})$ begins.

During the first bit clock of the first iteration, the multiplier 21 multiplies $\alpha^1$ with $\Omega_1\alpha^{-N}$ provided thereto from $R_8$. To do this, $\alpha^1$ is fed from the root input block 22 to the multiplier 21. The output of the multiplier 21, i.e., $\Omega_1\alpha^{-((N-1))}$ (or in other words, 1st evaluating term of a first set, the Kth set of evaluating terms referring to $\Omega_i\alpha^{-(N-K)}$'s, K being 1 to N), is fed to the addition block 23 one per one bit clock cycle. Note that $\alpha^i$ (instead of $\alpha^{-i}$ as in the conventional evaluator) is multiplied to the evaluating terms provided from the register block 28, to update the evaluating terms.

The addition block 23 includes a two input adder 23a and a register 23b, wherein the adder 23a operating on the finite field $GF(2^m)$ sequentially adds each of the evaluating terms provided from the multiplier 21 to the contents of the register 23b, and the register 23b stores a 1st to 7th partial sum of the evaluating terms provided from the adder 23a and feeds the partial sum to the two input adder 23a, the Lth partial sum referring to sums of L evaluating terms included in a same set, L being 1 to 7, in the course of sequential addition of Eq. (5B). It also includes a multiplexor ("MUX")

23c for selectively providing 0 or the output of the adder 23a to the register 23b under the control of RST_SUM which is essentially identical to that shown in FIG. 1. RST_SUM also serves to initialize the register 23b by rendering MUX to provide 0 to the register 23b at the start of each iteration.

Specifically, upon receiving $\Omega_1\alpha^{-(N-1)}$ from the multiplier 21, the adder 23a adds it to the initial content, i.e., 0, of the register 23b. Then the 1st partial sum, $\Omega_1\alpha^{-(N-1)}$, is fed back through the MUX 23c to the register 23b, to be stored therein, e.g., at the rising edge of the next bit clock. To do this, the MUX 23c provides the output of the adder 23a to the register 23b in response to RST_SUM. $\Omega_1\alpha^{-(N-1)}$ provided from the multiplier 21 is also fed to the register block 28, to thereby shift the contents of each register to right, e.g., at the rising edge of the second bit clock of the first iteration. The contents of the registers, during the second bit clock cycle, are given in Table 4.

TABLE 4

| $R_1$ | $R_2$ | $R_3$ | ... | $R_7$ | $R_8$ |
|---|---|---|---|---|---|
| $\Omega_1\alpha^{-(n-1)}$ | $\Omega_8\alpha^{-8N}$ | $\Omega_7\alpha^{-7N}$ | ... | $\Omega_3\alpha^{-3N}$ | $\Omega_2\alpha^{-2N}$ |

During the second bit clock cycle of the first iteration, the multiplier 21 multiplies $\alpha^2$ to $\Omega_2\alpha^{-2N}$ provided thereto from $R_8$. The output of the multiplier 21, i.e., $\Omega_2\alpha^{-2(N-1)}$ at this time, is fed to the adder 23a, wherein it is added to the contents of the register 23b, i.e., $\Omega_1\alpha^{-(N-1)}$. Then the second partial sum, $\Omega_1\alpha^{-(N-1)}+\Omega_2\alpha^{-2(N-1)}$, is fed back through the MUX 23c to the register 23b, to be stored therein. $\Omega_2\alpha^{-2(N-1)}$ from the multiplier 21 is also fed to the register block 28, to thereby shift contents of each register to right at the rising edge of the next bit clock cycle. Then, the contents of the registers are changed as given in table 5.

TABLE 5

| $R_1$ | $R_2$ | $R_3$ | ... | $R_7$ | $R_8$ |
|---|---|---|---|---|---|
| $\Omega_2\alpha^{-2(n-1)}$ | $\Omega_1\alpha^{-(N-1)}$ | $\Omega_8\alpha^{-8N}$ | ... | $\Omega_4\alpha^{-4N}$ | $\Omega_3\alpha^{-3N}$ |

By repeating the above procedure for the remaining bit clock cycles of the first iteration, $\Omega_1\alpha^{-(N-1)}$ to $\Omega_8\alpha^{-8(N-1)}$ is summed at the addition block 23. The adder 23a finally provides an 8th partial sum, i.e., a sum of the 8 evaluating terms $(\Omega_1\alpha^{-(N-1)}+\Omega_2\alpha^{-2(N-1)}+\ldots+\Omega_8\alpha^{-8(N-1)})$ of the first set to the output block 24. The sum is fed to and stored in $Ri_0$ in response to RST_SUM and then fed to an adder 24b wherein it is added to $\Omega_0$, to thereby provide the final result of the first iteration, i.e., the first evaluation result $\Omega(\alpha^{-(N-1)})$. At the same time, the register 23b is initialized to 0 provided from the MUX 23c in response to RST_SUM for a next iteration.

A second iteration is similar to the first iteration except that a second set of evaluating terms $\Omega\alpha^{-i(N-2)}$'s is provided from the multiplier 21 to the addition block 23 and back to the register block 28. Specifically, $\alpha^1$ is multiplied with $\Omega_1\alpha^{-(N-1)}$ during the first bit clock cycle, $\alpha^2$ with $\Omega_2\alpha^{-2(N-1)}$ during the second bit clock cycle, and so on, to provide the second set of evaluating terms. By summing the second set of evaluating terms, $\Omega_i\alpha^{-i(N-2)}$'s, the second evaluation result $\Omega(\alpha^{-(N-2)})$ is obtained at the end of the second iteration. By repeating the above procedure, $\Omega(\alpha^{-j})$'s for j=N−1 to 0 are obtained in N iterations.

The contents of the registers $R_1$ to $R_8$ and $R_9$ for each bit clock cycle of the first to third iterations are shown in Table 6, wherein each row corresponds to each bit clock cycle.

TABLE 6

| iteration | $R_1$ | $R_2$ | ... | $R_8$ | $R_9$ |
|---|---|---|---|---|---|
| 1st | $\Omega_8\alpha^{-8N}$<br>$\Omega_1\alpha^{-(N-1)}$ | $\Omega_7\alpha^{-7N}$<br>$\Omega_8\alpha^{-8N}$ | ... | $\Omega_1\alpha^{-N}$<br>$\Omega_2\alpha^{-2N}$ | 0<br>$\Omega_1\alpha^{-(N-1)}$ |
| | . | . | | . | . |
| 2nd | $\Omega_7\alpha^{-7(N-1)}$<br>$\Omega_8\alpha^{-8(N-1)}$<br>$\Omega_1\alpha^{-(N-2)}$<br>$\Omega_2\alpha^{-2(N-2)}$ | $\Omega_6\alpha^{-6(N-1)}$<br>$\Omega_7\alpha^{-7(N-1)}$<br>$\Omega_8\alpha^{-8(N-1)}$<br>$\Omega_1\alpha^{-(N-2)}$ | ... | $\Omega_8\alpha^{-8N}$<br>$\Omega_1\alpha^{-(N-1)}$<br>$\Omega_2\alpha^{-2(N-1)}$<br>$\Omega_3\alpha^{-3(N-1)}$ | $\Omega_1\alpha^{-(N-1)}+\ldots+\Omega_7\alpha^{-7(N-1)}$<br>0<br>$\Omega_1\alpha^{-(N-2)}$<br>$\Omega_1\alpha^{-(N-2)} + \Omega_2\alpha^{-2(N-2)}$ |
| | . | . | | . | . |
| 3rd | $\Omega_7\alpha^{-7(N-2)}$<br>$\Omega_8\alpha^{-8(N-2)}$<br>$\Omega_1\alpha^{-(N-3)}$<br>$\Omega_2\alpha^{-2(N-3)}$ | $\Omega_6\alpha^{-6(N-2)}$<br>$\Omega_7\alpha^{-7(N-2)}$<br>$\Omega_8\alpha^{-8(N-2)}$<br>$\Omega_1\alpha^{-(N-3)}$ | ... | $\Omega_8\alpha^{-8(N-1)}$<br>$\Omega_1\alpha^{-(N-2)}$<br>$\Omega_2\alpha^{-2(N-2)}$<br>$\Omega_3\alpha^{-3(N-2)}$ | $\Omega_1\alpha^{-(N-2)}+\ldots+\Omega_7\alpha^{-7)N-2)}$<br>0<br>$\Omega_1\alpha^{-(N-3)}$<br>$\Omega_1\alpha^{-(N-3)} + \Omega_2\alpha^{-2(N-3)}$ |
| | . | . | | . | . |
| | $\Omega_7\alpha^{-7(N-3)}$ | $\Omega_6\alpha^{-6(N-3)}$ | | $\Omega_8\alpha^{-8(N-2)}$ | $\Omega_1\alpha^{-(N-3)}+\ldots+\Omega_7\alpha^{-7(N-3)}$ |

Figure 3:
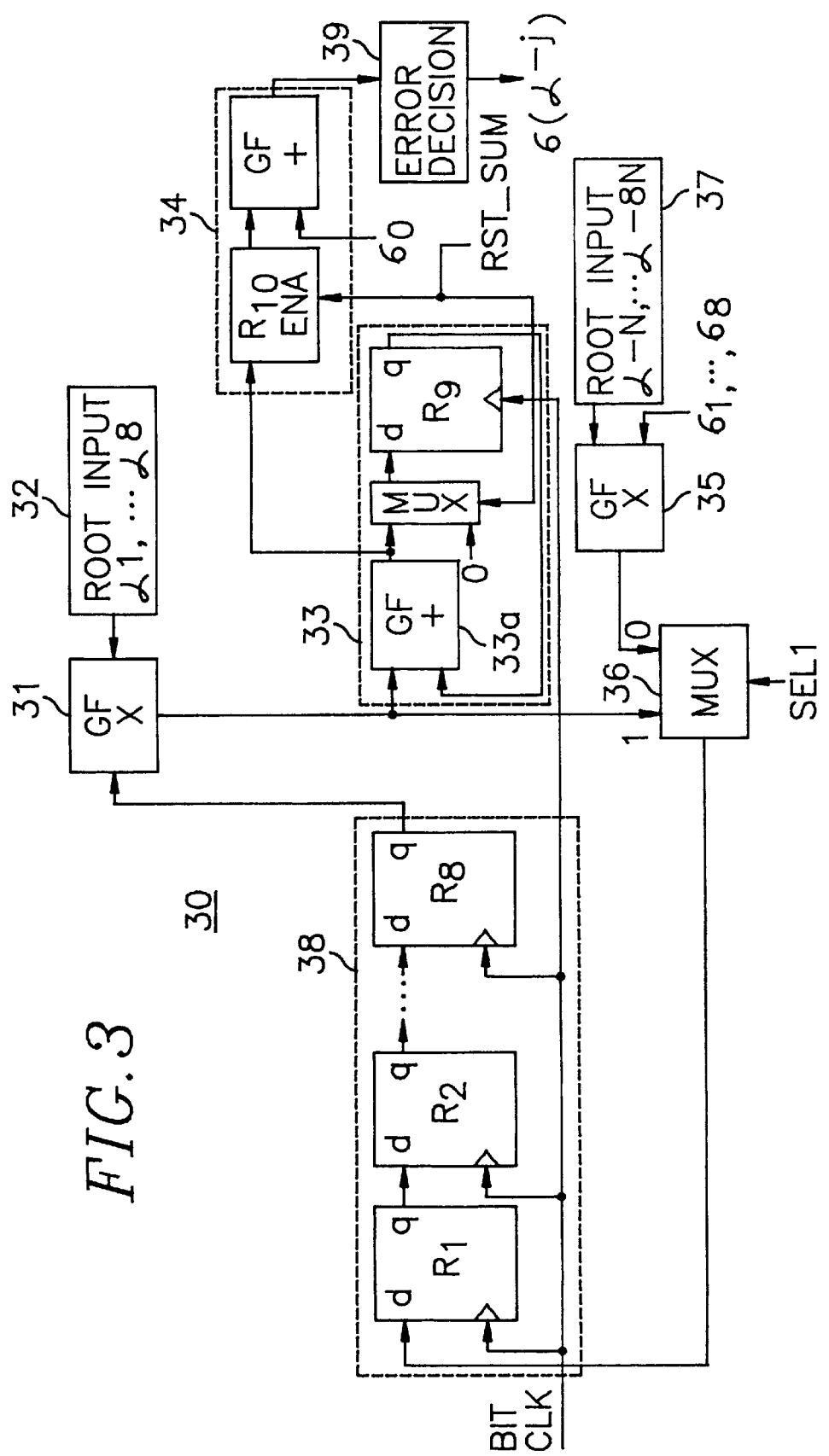
FIG. 3 presents a block diagram of a second embodiment of the polynomial evaluator for evaluating an error locator polynomial in accordance with the present invention.

Referring now to FIG. 3, there is provided a block diagram of another embodiment of the polynomial evaluator in accordance with the present invention, which evaluates the error locator polynomial σ(X). The structure and function of the evaluator 30 shown in FIG. 3 are essentially identical to those of the evaluator 20 except an additional error decision block 39. As the object of the evaluator 30 is to evaluate the error locator polynomial, the coefficients of the error locator polynomial aj are fed to a multiplier 35. By the same procedure explained with reference to FIG. 2, an output block 34 provides the evaluation result σ($\alpha^{-j}$), j=N−1 to 0 in that order, for each iteration.

At the error decision block 39, in case σ($\alpha^{-j}$) is 0, an error signal, which notifies that an error has occurred at a corresponding symbol $r_j$ of a codeword, is generated. It should be noted that as the evaluation result for larger j is determined first, $r_j$ with larger j is first examined for its error.

Figure 4:
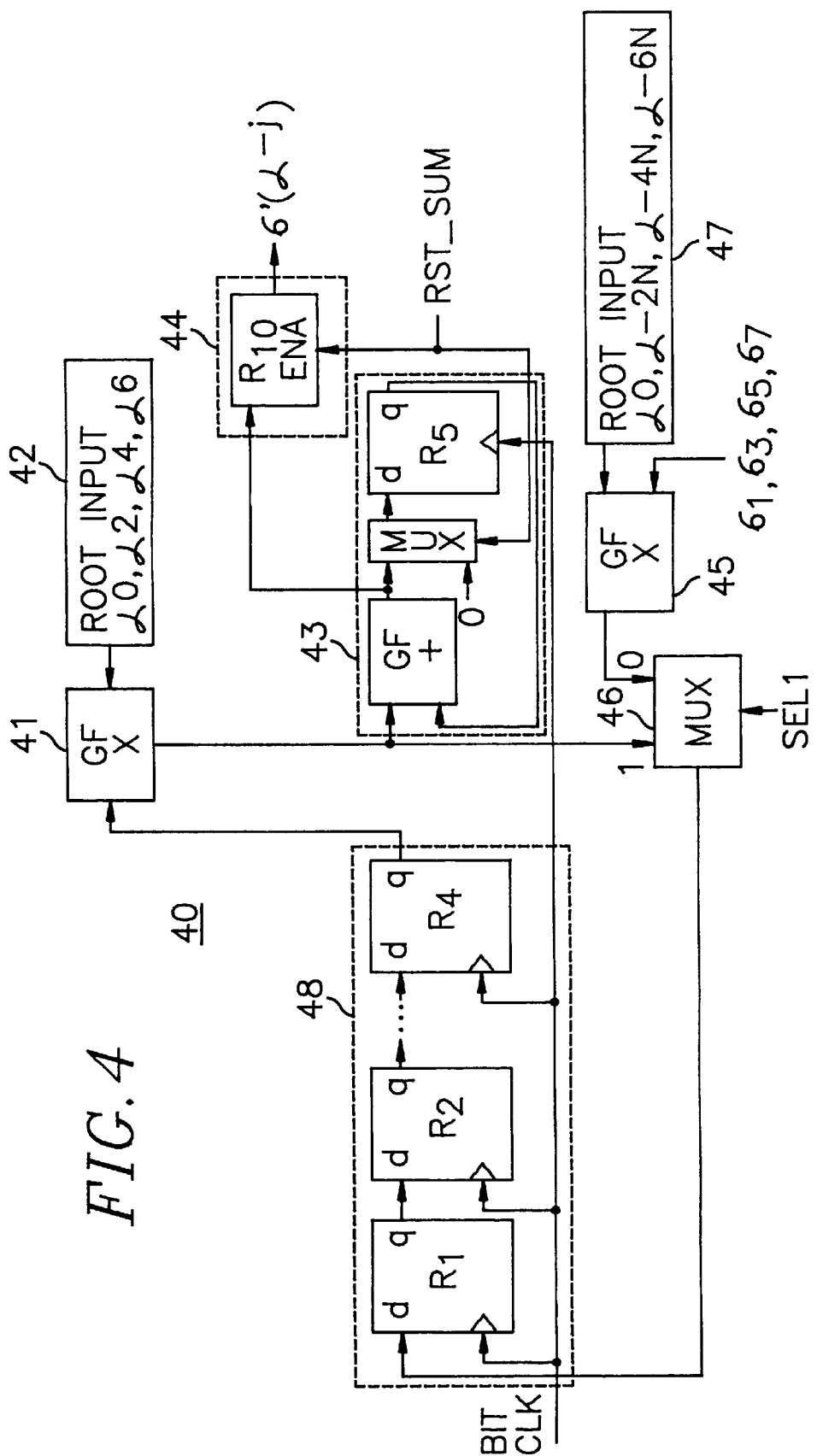
FIG. 4 provides a block diagram of a third embodiment of the polynomial evaluator for evaluating a differential polynomial in accordance with the present invention.

Referring to FIG. 4, there is provided a block diagram of a third embodiment of the polynomial evaluator in accordance with the present invention, which evaluates the differential polynomial $\sigma'(X)$, i.e., the first derivative of the error locator polynomial $\sigma(X)$.

When the error locator polynomial is an 8th order polynomial represented as $$\sigma(X)=\sigma_0+\sigma_1 X+\sigma_2 X^2+\sigma_3 X^3+\sigma_4 X^4+\sigma_5 X^5+\sigma_6 X^6+\sigma_7 X^7 30 \; \sigma_8 X^8, \quad \text{Eq. (6)}$$

the differential polynomial is given as $$\sigma'(X)=\sigma_1+2\sigma_2 X^1+3\sigma_3 X^2+4\sigma_4 X^3+5\sigma_5 X^4+6\sigma_6 X^5+7\sigma_7 X^6+8\sigma_8 X^7 \quad \text{Eq.(7A)}$$

Since two identical numbers in the finite field yield 0, Eq. (7A) is further simplified as $$\sigma'(X)=\sigma_1+\sigma_3 X^2+\sigma_5 X^4+\sigma_7 X^6 \quad \text{Eq. (7B)}$$

Accordingly, evaluating $\sigma'(X)$ for $\alpha^{-j}$ gives $$\sigma'(\alpha^{-j}) = \sum_{i=1,(i=\text{odd})}^{T} \sigma_i \cdot (\alpha^{-(i-1)})^j \quad \text{Eq. (7C)}$$

The structure of the evaluator is modified to deal with Eq. (7C), which distinguishes the evaluator 40 from the evaluator 20. Specifically, as the evaluation result of the differential polynomial includes only even powers of $\alpha$, the root input blocks 42 and 47 provides only even powers of $\alpha$, i.e., ($\alpha^0$, $\alpha^2$, $\alpha^4$, $\alpha^6$) and ($\alpha^0$, $\alpha^{-2N}$, $\alpha^{-4N}$, $\alpha^{-6N}$); the register block 48 includes half as many registers as those of other evaluators shown in FIGS. 2 and 3; only coefficients of odd power terms, i.e., $\sigma_1, \sigma_3, \sigma_5, \sigma_7$, are provided to a multiplier 45 in the finite field GF($2^m$); and the output block 44 does not include an adder, for the 0th coefficient ($\sigma_0$) is not included in the evaluation result. Except these, overall operation of the evaluator is similar to the evaluator 20 shown in FIG. 2. The contents of the registers $R_1$ to $R_5$ for each bit clock cycle of first to third iterations are shown in Table 7, wherein each row may correspond to each bit clock cycle.

TABLE 7

| iter-ation | $R_1$ | $R_2$ | $R_4$ | $R_5$ |
|---|---|---|---|---|
| 1st | $\Omega_7\alpha^{-6N}$ | $\Omega_5\alpha^{-4N}$ | $\Omega_1$ | 0 |
| | $\Omega_1$ | $\Omega_7\alpha^{-6N}$ | $\Omega_3\alpha^{-2N}$ | $\Omega_1$ |
| | $\Omega_3\alpha^{-2(N-1)}$ | $\Omega_1$ | $\Omega_5\alpha^{-4N}$ | $\Omega_1 + \Omega_3\alpha^{-2(N-1)}$ |
| | $\Omega_5\alpha^{-4(N-1)}$ | $\Omega_3\alpha^{-2(N-1)}$ | $\Omega_7\alpha^{-6N}$ | $\Omega_1 + \Omega_3\alpha^{-2(N-1)} + \Omega_5\alpha^{-4(N-1)}$ |
| 2nd | $\Omega_7\alpha^{-6(N-1)}$ | $\Omega_5\alpha^{-4(N-1)}$ | $\Omega_1$ | 0 |
| | $\Omega_1$ | $\Omega_7\alpha^{-6(N-1)}$ | $\Omega_3\alpha^{-2(N-1)}$ | $\Omega_1$ |
| | $\Omega_3\alpha^{-2(N-2)}$ | $\Omega_1$ | $\Omega_5\alpha^{-4(N-1)}$ | $\Omega_1 + \Omega_3\alpha^{-2(N-2)}$ |
| | $\Omega_5\alpha^{-4(N-2)}$ | $\Omega_3\alpha^{-2(N-2)}$ | $\Omega_7\alpha^{-6(N-1)}$ | $\Omega_1 + \Omega_3\alpha^{-2(N-2)} + \Omega_5\alpha^{-4(N-2)}$ |
| 3rd | $\Omega_7\alpha^{-6(N-2)}$ | $\Omega_5\alpha^{-4(N-2)}$ | $\Omega_1$ | 0 |
| | $\Omega_1$ | $\Omega_7\alpha^{-6(N-2)}$ | $\Omega_3\alpha^{-2(N-2)}$ | $\Omega_1$ |
| | $\Omega_3\alpha^{-2(N-3)}$ | $\Omega_1$ | $\Omega_5\alpha^{-4(N-2)}$ | $\Omega_1 + \Omega_3\alpha^{-2(N-3)}$ |
| | $\Omega_5\alpha^{-4(N-3)}$ | $\Omega_3\alpha^{-2(N-3)}$ | $\Omega_7\alpha^{-6(N-2)}$ | $\Omega_1 + \Omega_3\alpha^{-2(N-3)} + \Omega_5\alpha^{-4(N-3)}$ |

As explained above, the evaluator in accordance with the present invention provides the evaluation results in a reversed order compared with the conventional evaluator.

While the present invention has been described with respect to the particular embodiments, it will be apparent to those skilled in the art that various changes and modifications may be made without departing from the spirit and scope of the invention as defined in the following claims.

What is claimed is:

1. An apparatus, for use in a Reed-Solomon decoder, for evaluating a polynomial P(X) iteratively, by substituting $\alpha^{-(N-j)}$ for X in a jth iteration, to thereby provide a jth evaluation result $P(\alpha^{-(N-j)})$, wherein j is an integer ranging from 1 to N, N being a predetermined positive integer, and $\alpha$ is a primitive element in a finite field GF($2^m$), said apparatus comprising:

a FIFO buffer having T memory means, T being a predefined positive integer;

updating means for sequentially multiplying the contents of the FIFO buffer with a first group of T elements in the finite field, to thereby provide a jth set of T evaluating terms during the jth iteration;

means for generating T initial evaluating terms;

means for selectively providing the T initial evaluating terms or the jth set of T evaluating terms provided from the updating means to the FIFO buffer, to be stored therein;

first addition means for determining a sum of the T evaluating terms of the jth set, to thereby provide a jth sum; and second addition means, during the jth iteration, for adding a 0th coefficient of the polynomial to the jth sum, to thereby provide the jth evaluation result.

2. The apparatus of claim 1, wherein the first addition means includes:

an adder for adding an evaluating term provided from the multiplication means with a feedback value, to thereby provide a partial sum or the jth sum;

selection means for selectively providing the partial sum provided from the adder or 0; and memory means for storing the partial sum or 0 provided from the selection means and providing the partial sum or 0 as the feedback value to the adder.

3. The apparatus of claim 1, wherein the generation means includes:

second input means for sequentially providing a second group of T elements in the finite field; and means for sequentially multiplying the second group of T elements in the finite field provided from the second input means with first to Tth coefficients of the polynomial, to thereby provide the T initial evaluating terms.

4. The apparatus of claim 1, wherein the updating means includes:

first input means for sequentially providing the first group of T elements in the finite field during the jth iteration; and means for sequentially multiplying the contents of the FIFO buffer with the first group of T elements in the finite field provided from the first input means, to thereby provide the jth set of T evaluating terms during the jth iteration.

5. The apparatus of claim 3, wherein the first group of T elements are $\alpha^i$'s and the second group of T elements are $\alpha^{-iN}$'s i being an integer ranging from 1 to T.

6. The apparatus of claim 1, wherein the polynomial P(X) is an error evaluator polynomial of an order T.

7. The apparatus of claim 1, wherein the polynomial P(X) is an error locator polynomial of an order T.

8. The apparatus of claim 1 further comprising means for deciding whether the evaluation result equals 0, to thereby provide an error signal.

9. An apparatus, for use in a Reed-Solomon decoder, for evaluating a polynomial P(X) iteratively, by substituting $\alpha^{-(N-j)}$ for X in a jth iteration, to thereby provide a jth evaluation result $P(\alpha^{-(N-j)})$, wherein j is an integer ranging from 1 to N, N being a predetermined positive integer, and $\alpha$ is a primitive element in a finite field $GF(2^m)$, said apparatus comprising:

a FIFO buffer having T memory means, T being a predefined positive integer;

means for initializing the FIFO buffer with T initial evaluating terms by sequentially providing the T initial evaluating terms to the FIFO buffer;

updating means for sequentially multiplying the contents of the FIFO buffer with a first group of T elements in the finite field, to thereby provide a jth set of T evaluating terms during the jth iteration;

means for sequentially providing the jth set of T evaluating terms during the jth iteration, to the FIFO buffer, to be stored therein;

first addition means for determining a sum of the T evaluating terms of the jth set, to thereby provide a jth sum; and second addition means, during the jth iteration, for adding a 0th coefficient of the polynomial to the jth sum, to thereby provide the jth evaluation result.

10. The apparatus of claim 9, wherein the first addition means includes:

an adder for adding an evaluating term provided from the multiplication means with a feedback value, to thereby provide a partial sum or the jth sum;

selection means for selectively providing the partial sum provided from the adder or 0; and memory means for storing the partial sum or 0 provided from the selection means and providing the partial sum or 0 as the feedback value to the adder.

11. The apparatus of claim 9, wherein the updating means includes:

first input means for sequentially providing the first group of T elements in the finite field during the jth iteration; and means for sequentially multiplying the contents of the FIFO buffer with the first group of T elements in the finite field provided from the first input means, to thereby provide the jth set of T evaluating terms during the jth iteration.

12. The apparatus of claim 10, wherein the first group of T elements are $\alpha^i$, s, i being an integer ranging from 1 to T.

13. The apparatus of claim 9, wherein the polynomial P(X) is an error evaluator polynomial of an order T.

14. The apparatus of claim 9, wherein the polynomial P(X) is an error locator polynomial of an order T.

15. The apparatus of claim 9 further comprising means for deciding whether the evaluation result equals 0, to thereby provide an error signal.

16. An apparatus, for use in a Reed-Solomon decoder, for evaluating a polynomial P(X) iteratively, by substituting $\alpha^{-(N-j)}$ for X in a jth iteration, to thereby provide a jth evaluation result $P(\alpha^{-(N-j)})$, wherein j is an integer ranging from 1 to N, N being a predetermined positive integer, and a is a primitive element in a finite field $GF(2^m)$, said apparatus comprising:

a FIFO buffer having T memory means, T being a predefined positive integer;

updating means for sequentially multiplying the contents of the FIFO buffer with a first group of T elements in the finite field, to thereby provide a jth set of T evaluating terms during the jth iteration;

means for generating T initial evaluating terms;

means for selectively providing the T initial evaluating terms or the jth set of T evaluating terms to the FIFO buffer, to be stored therein; and addition means for determining a sum of the T evaluating terms of the jth set, to thereby provide the jth evaluation result.

17. The apparatus of claim 16, wherein the updating means includes:

first input means for sequentially providing the first group of T elements in the finite field during the jth iteration; and means for sequentially multiplying the contents of the FIFO buffer with the first group of T elements in the finite field provided from the first input means, to thereby provide the jth set of T evaluating terms during the jth iteration.

18. The apparatus of claim 16, wherein the addition means includes:

an adder for adding an evaluating term provided from the multiplication means with a feedback value, to thereby provide a partial sum or the jth evaluation result;

selection means for selectively providing the partial sum provided from the adder or 0; and memory means for storing the partial sum or 0 provided from the selection means and providing the partial sum or 0 as the feedback value to the adder.

19. The apparatus of claim 16, wherein the generation means includes:

second input means for sequentially providing a second group of T elements in the finite field; and means for sequentially multiplying the second group of T elements in the finite field provided from the second input means with first to Tth coefficients of the polynomial, to thereby provide the T initial evaluating terms.

20. The apparatus of claim 16, wherein the polynomial P(X) is a first derivative of an error locator polynomial of an order 2T; the 1st to Tth coefficients are coefficients of odd power terms of the error locator polynomial; the first group of T elements are $\alpha^0, \alpha^2, \ldots, \alpha^{2T-2}$; and the second group of T elements are $\alpha^0, \alpha^{-2N}, \ldots, \alpha^{-(2T-2)N}$.

21. An apparatus for iteratively evaluating a polynomial over a finite field, said finite field having a primitive element $\alpha$, said apparatus comprising:

a FIFO buffer having an FIFO buffer input, a FIFO buffer output and T memory means, T being a predefined positive integer;

a first finite field multiplier arranged to multiply each of a first sequence comprising T powers of $\alpha$ with a corresponding one of T coefficients of the polynomial being evaluated, to thereby provide a set of T initialization terms;

a second finite field multiplier arranged to multiply each of a second sequence comprising T powers of $\alpha$ with a corresponding one of T consecutive outputs of said FIFO buffer, to thereby provide a jth set of T evaluating terms during a jth iteration, j being a positive integer;

selection means arranged to provide said FIFO input with said T initialization terms prior to a 1st iteration, and further arranged to provide said jth set of T evaluating terms during a jth iteration; and first addition means arranged to receive and add said T evaluating terms to thereby produce a jth sum, during the jth iteration.

22. The apparatus of claim 21, further comprising second addition means arranged to receive and add said jth sum with a 0th coefficient of the polynomial being evaluated, to thereby provide a jth evaluation result, during the jth iteration.

23. The apparatus of claim 22, wherein said first sequence comprises T powers of $\alpha$: $\alpha^{-N}, \alpha^{-2N}, \alpha^{-3N} \ldots \alpha^{-TN}$, N being a predetermined positive integer, and said second sequence comprises T consecutive positive powers of $\alpha$: $\alpha^1, \alpha^2, \alpha^3 \ldots \alpha^T$.

24. The apparatus of claim 21, wherein said first sequence comprises T even positive powers of $\alpha$, and said second sequence comprises T even negative powers of $\alpha$.

* * * * *